United States Patent
Bernardina et al.

(10) Patent No.: US 9,683,112 B2
(45) Date of Patent: Jun. 20, 2017

(54) THICK-FILM PASTE CONTAINING LEAD-TUNGSTEN-BASED OXIDE AND ITS USE IN THE MANUFACTURE OF SEMICONDUCTOR DEVICES

(71) Applicant: E I DU PONT DE NEMOURS AND COMPANY, Wilmington, DE (US)

(72) Inventors: Katherine Anne Bernardina, Durham, NC (US); Brian J Laughlin, Apex, NC (US); Paul Douglas Vernooy, Hockessin, DE (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 193 days.

(21) Appl. No.: 14/519,404

(22) Filed: Oct. 21, 2014

(65) Prior Publication Data
US 2016/0108255 A1    Apr. 21, 2016

(51) Int. Cl.
| | |
|---|---|
| *H01B 1/16* | (2006.01) |
| *C09D 5/24* | (2006.01) |
| *C03C 8/10* | (2006.01) |
| *H01L 31/18* | (2006.01) |
| *H01L 31/0224* | (2006.01) |
| *C03C 3/12* | (2006.01) |
| *C03C 8/18* | (2006.01) |
| *H01B 1/22* | (2006.01) |
| *C03C 3/07* | (2006.01) |
| *C03C 3/14* | (2006.01) |
| *C03C 17/00* | (2006.01) |

(52) U.S. Cl.
CPC ............... *C09D 5/24* (2013.01); *C03C 3/07* (2013.01); *C03C 3/122* (2013.01); *C03C 3/142* (2013.01); *C03C 8/10* (2013.01); *C03C 8/18* (2013.01); *C03C 17/008* (2013.01); *H01B 1/16* (2013.01); *H01B 1/22* (2013.01); *H01L 31/022425* (2013.01); *H01L 31/18* (2013.01); *C03C 2217/445* (2013.01); *C03C 2218/119* (2013.01)

(58) Field of Classification Search
CPC .... H01B 1/00; H01B 1/16; H01B 1/22; C03C 3/07; C03C 3/12; C03C 3/142; C03C 4/16; C03C 14/004
See application file for complete search history.

(56) References Cited

U.S. PATENT DOCUMENTS

| | | | | |
|---|---|---|---|---|
| 4,436,829 A | * | 3/1984 | Howell | H01C 7/06 252/520.5 |
| 2014/0306166 A1 | | 10/2014 | Jung et al. | |
| 2015/0243809 A1 | * | 8/2015 | Raskar | H01L 31/022425 136/256 |

FOREIGN PATENT DOCUMENTS

| | | |
|---|---|---|
| JP | H03263391 A | 11/1991 |
| JP | 2006005172 A | 1/2006 |

OTHER PUBLICATIONS

International Preliminary Report on Patentability for International Patent Application No. PCT/US2015/056162 Dated Apr. 25, 2016.

* cited by examiner

*Primary Examiner* — Mark Kopec

(57) ABSTRACT

The present invention provides a thick-film paste for printing the front side of a solar cell device having one or more insulating layers and a method for doing so. The thick-film paste comprises a source of an electrically conductive metal and a lead-tungsten-based oxide dispersed in an organic medium. The invention also provides a semiconductor device comprising an electrode formed from the thick-film paste.

6 Claims, 1 Drawing Sheet

_US 9,683,112 B2_

THICK-FILM PASTE CONTAINING LEAD-TUNGSTEN-BASED OXIDE AND ITS USE IN THE MANUFACTURE OF SEMICONDUCTOR DEVICES

FIELD OF THE INVENTION

The present invention provides a thick-film paste for printing the front side of a solar cell device having one or more insulating layers. The thick-film paste comprises a source of an electrically conductive metal, a lead-tungsten-based oxide and an organic medium.

TECHNICAL BACKGROUND

A conventional solar cell structure with a p-type base has a negative electrode that is typically on the front side (sun side) of the cell and a positive electrode on the back-side. Radiation of an appropriate wavelength falling on a p-n junction of a semiconductor body serves as a source of external energy to generate hole-electron pairs in that body. As a result of the potential difference which exists at a p-n junction, holes and electrons move across the junction in opposite directions and thereby give rise to flow of an electric current that is capable of delivering power to an external circuit. Most solar cells are in the form of a silicon wafer that has been metalized, i.e., provided with metal contacts that are electrically conductive.

Conductive inks are typically used to form the conductive grids or metal contacts. Conductive inks typically comprise a glass frit, a conductive species (e.g., silver particles), and an organic medium. To form the metal contacts, conductive inks are printed onto a substrate as grid lines or other patterns and then fired, during which electrical contact is made between the grid lines and the semiconductor substrate.

However, crystalline silicon solar cells are typically coated with an anti-reflective coating such as silicon nitride, titanium oxide, or silicon oxide to promote light adsorption, which increases the cells' efficiency. Such anti-reflective coatings also act as an insulator which impairs the flow of electrons from the substrate to the metal contacts. To overcome this problem, the conductive ink should penetrate the anti-reflective coating during firing to form metal contacts having electrical contact with the semiconductor substrate. Formation of a strong bond between the metal contact and the substrate and solderability are also desirable.

The ability to penetrate the anti-reflective coating and form a strong bond with the substrate upon firing is highly dependent on the composition of the conductive ink and firing conditions. Efficiency, a key measure of solar cell performance, is also influenced by the quality of the electrical contact made between the fired conductive ink and the substrate.

Alternatively, a reverse solar cell structure with an n-type silicon base is also known. This cell has a front p-type silicon surface (front p-type emitter) with a positive electrode on the front-side and a negative electrode to contact the back-side of the cell. Solar cells with n-type silicon bases (n-type silicon solar cells) can in theory produce higher efficiency gains compared to solar cells with p-type silicon bases owing to the reduced recombination velocity of electrons in the n-doped silicon.

To provide an economical process for manufacturing solar cells with good efficiency, there is a need for thick-film paste compositions that can be fired at low temperatures to penetrate an anti-reflective coating and provide good electrical contact with the semiconductor substrate.

SUMMARY OF THE INVENTION

This invention provides a thick-film paste composition comprising:
  a) 80-99.5 wt % of a source of electrically conductive metal;
  b) 0.5 to 20 wt % of a vanadium-free, tellurium-free lead-tungsten-based oxide; and
  c) an organic medium;
wherein the source of electrically conductive metal and the lead-tungsten-based oxide are dispersed in the organic medium and wherein the above wt % are based on the total weight of the source of electrically conductive metal and the vanadium-free, tellurium-free lead-tungsten-based oxide, the vanadium-free, tellurium-free lead-tungsten-based oxide comprising 55-88 wt % PbO, 12-25 wt % $WO_3$ and 0-20 wt % of one or more additional oxides selected from the group consisting of $B_2O_3$, $Bi_2O_3$, $SiO_2$, $Al_2O_3$, $Li_2O$, $K_2O$, $Rb_2O$, $Na_2O$, $Cs_2O$ and $MoO_3$, wherein the wt % of PbO, $WO_3$ and the one or more additional oxides are based on the total weight of the vanadium-free tellurium-free lead-tungsten-based oxide.

This invention also provides a vanadium-free, tellurium-free lead-tungsten-based oxide comprising 55-88 wt % PbO, 12-25 wt % $WO_3$ and 0-20 wt % of one or more additional oxides selected from the group consisting of $B_2O_3$, $Bi_2O_3$, $SiO_2$, $Al_2O_3$, $Li_2O$, $K_2O$, $Rb_2O$, $Na_2O$, $Cs_2O$ and $MoO_3$, wherein the wt % are based on the total weight of the vanadium-free, tellurium-free lead-tungsten-based oxide.

This invention further provides a process comprising:
  (a) providing an article comprising one or more insulating films disposed onto at least one surface of a semiconductor substrate;
  (b) applying a thick-film paste composition onto the one or more insulating films to form a layered structure, the thick-film paste composition comprising:
    (i) 80-99.5 wt % of a source of electrically conductive metal;
    (ii) 0.5 to 20 wt % of a vanadium-free, tellurium-free lead-tungsten-based oxide; and
    (iii) an organic medium;
wherein the source of electrically conductive metal and the vanadium-free, tellurium-free lead-tungsten-based oxide are dispersed in the organic medium and wherein the above wt % are based on the total weight of the source of electrically conductive metal and the vanadium-free, tellurium-free lead-tungsten-based oxide, the vanadium-free, tellurium-free lead-tungsten-based oxide comprising 55-88 wt % PbO, 12-25 wt % $WO_3$ and 0-20 wt % of one or more additional oxides selected from the group consisting of $B_2O_3$, $Bi_2O_3$, $SiO_2$, $Al_2O_3$, $Li_2O$, $K_2O$, $Rb_2O$, $Na_2O$, $Cs_2O$ and $MoO_3$, wherein the wt % of PbO, $WO_3$ and the one or more additional oxides are based on the total weight of the vanadium-free, tellurim-free lead-tungsten-based oxide; and
  (c) firing the semiconductor substrate, the one or more insulating films, and the thick-film paste wherein the organic medium of the thick film paste is volatilized, thereby forming an electrode in contact with the one or more insulating layers and in electrical contact with the semiconductor substrate.

This invention, in addition, provides a semiconductor device comprising an electrode formed from a thick-film paste composition comprising:

(a) 80-995 wt % of a source of electrically conductive metal;
(b) 0.5 to 20 wt % of a vanadium-free, tellurium-free lead-tungsten-based oxide; and
(c) an organic medium, wherein the source of electrically conductive metal and the vanadium-free, tellurium-free lead-tungsten-based oxide are dispersed in the organic medium and wherein the above wt % are based on the total weight of the source of electrically conductive metal and the vanadium-free, tellurium-free lead-tungsten-based oxide, the vanadium-free, tellurium-free lead-tungsten-based oxide comprising 55-88 wt % PbO, 12-25 wt % $WO_3$ and 0-20 wt % of one or more additional oxides selected from the group consisting of $B_2O_3$, $Bi_2O_3$, $SiO_2$, $Al_2O_3$, $Li_2O$, $K_2O$, $Rb_2O$, $Na_2O$, $Cs_2O$ and $MoO_3$, wherein the wt % of PbO, $WO_3$ and the one or more additional oxides are based on the total weight of the vanadium-free, tellurium-free lead-tungsten-based oxide and wherein the thick film paste composition has been fired to remove the organic medium and form the electrode.

DETAILED DESCRIPTION OF THE INVENTION

Figure 1A:
FIGS. 1A-1F show a process flow diagram illustrating the fabrication of a semiconductor device. Reference numerals shown in FIGS. 1A-1F are explained below.
10: p-type silicon substrate
20: n-type diffusion layer
30: insulating film
40: p+ layer (back surface field, BSF)
60: aluminum paste disposed on back side
61: aluminum back electrode (obtained by firing back-side aluminum paste)
70: silver or silver/aluminum paste disposed on back side
71: silver or silver/aluminum back electrode (obtained by firing back-side silver paste)
500: thick-film paste of the invention disposed on front side
501: front electrode (formed by firing the thick-film paste of the invention)

As used herein, "thick-film composition" refers to a composition which, upon firing on a substrate, has a thickness of 1 to 100 microns. The thick-film compositions contain a conductive material, a vanadium-free, tellurium-free lead-tungsten-based oxide composition, and an organic medium. The thick-film composition may include additional components. As used herein, the additional components are termed "additives".

The composition described herein include one or more electrically functional materials and one or more glass frits dispersed in an organic medium. This composition is a thick film-paste composition. The composition may also include one or more additive(s). Exemplary additives include metals, metal oxides or any compounds that can generate these metal oxides during firing.

In an embodiment, the electrically functional powders may be conductive powders. In an embodiment, the composition is used in a semiconductor device. In an aspect of this embodiment, the semiconductor device may be a solar cell or a photodiode. In a further aspect of this embodiment, the semiconductor device may be one of a broad range of semiconductor devices.

Electrically Conductive Metal

The thick-film composition includes a functional component that imparts appropriate electrically functional properties to the composition. The electrically functional component is an electrically conductive metal. The source of the electrically conductive metal can be in a flake form, a spherical form, a granular form, a crystalline form, a powder, or other irregular forms and mixtures thereof. The electrically conductive metal can be provided in a colloidal suspension.

In one embodiment, the source of the electrically conductive metal is from about 80 to about 99.5 wt %, wherein the weight percent (wt %) is based on the total weight of the source of electrically conductive metal and the vanadium-free, tellurium-free lead-tungsten-based oxide. In a further embodiment, the source of the electrically conductive metal is from about 90 to about 99 wt %, wherein the wt % is based on the total weight of the source of electrically conductive metal and the vanadium-free, tellurium-free lead-tungsten-based oxide.

The electrically conductive metal is selected from the group consisting of Ag, Cu, Au, Pd, Pt, Sn, Al, Ni and mixtures thereof. In an embodiment, the conductive particles may include silver (Ag). In a further embodiment, the conductive particles may include silver (Ag) and aluminum (Al). In a further embodiment, the conductive particles may, for example, include one or more of the following: Ag, Cu, Au, Pd, Pt, Al, Ni, Ag-Pd, and Pt-Au. In an embodiment, the conductive particles may include one or more of the following: (1) Al, Cu, Au, Ag, Pd and Pt; (2) an alloy of Al, Cu, Au, Ag, Pd and Pt; and (3) mixtures thereof.

When the electrically conductive metal is silver, it can be in the form of silver metal, alloys of silver, or mixtures thereof. The silver can also be in the form of silver oxide ($Ag_2O$), silver salts such as AgCl, Ag $NO_3$, $AgOOCCH_3$ (silver acetate), $AgOOCF_3$ (silver trifluoroacetate), silver orthophosphate ($Ag_3PO_4$), or mixtures thereof. Other forms of silver compatible with the other thick-film paste components can also be used.

In an embodiment, the functional phase of the composition may be coated or uncoated silver particles which are electrically conductive. In an embodiment in which the silver particles are coated, they are at least partially coated with a surfactant. In an embodiment, the surfactant may include one or more of the following non-limiting surfactants: stearic acid, palmitic acid, a salt of stearate, a salt of palmitate, lauric add, palmitic acid, oleic acid, stearic acid, capric acid, myristic acid and linoleic acid, and mixtures thereof. The counter ion may be, but is not limited to, hydrogen, ammonium, sodium, potassium and mixtures thereof.

The particle size of the silver is not subject to any particular limitation. In an embodiment, the average particle size may be less than 10 microns, and, in a further embodiment, no more than 5 microns. In an aspect, the average particle size may be 0.1 to 5 microns, for example. As used herein, "particle size" is intended to mean "average particle size"; "average particle size" means the 50% volume distribution size. The 50% volume distribution size can be denoted as $D_{50}$. Volume distribution size may be determined by a number of methods understood by one of skill in the art, including but not limited to LASER diffraction and dispersion method using a Microtrac particle size analyzer.

In an embodiment, the silver may be 60 to 90 wt % of the total paste composition. In a further embodiment, the silver may be 70 to 85 wt % of the total paste composition. In a further embodiment, the silver may be 75 to 85 wt % of the total paste composition.

In one embodiment, the silver is from about 80 to about 99.5 wt %, wherein the wt % is based on the total weight of the silver and the vanadium-free, tellurium-free lead-tungsten-based oxide. In a further embodiment, the silver is from about 90 to about 99 wt %, wherein the wt % is based on the total weight of the source of electrically conductive metal and the vanadium-free, tellurium-free lead-tungsten-based oxide.

In an embodiment, the silver portion of the thick-film paste composition includes about 80 to about 90 wt % spherical silver particles, wherein the wt % is based on the total weight of the source of electrically conductive metal and the vanadium-free, tellurium-free lead-tungsten-based oxide. In one embodiment, the solids portion of the thick-film paste composition includes about 80 to about 90 wt % silver particles and about 1 to about 9.5 wt % silver flakes, wherein the wt % is based on the total weight of the source of electrically conductive metal and the vanadium-free, tellurium-free lead-tungsten-based oxide.

In one embodiment, the thick-film paste composition includes coated silver particles that are electrically conductive. Suitable coatings include phosphorous and surfactants. Suitable surfactants include polyethylene oxide, polyethylene glycol, benzotriazole, polyethylene glycol)acetic acid, lauric acid, oleic acid, capric acid, myristic acid, linoleic acid, stearic acid, palmitic acid, stearate salts, palmitate salts, and mixtures thereof. The salt counter-ions can be ammonium, sodium, potassium, and mixtures thereof.

Vanadium-Free, Tellurium-Free Lead-Tungsten-Based Oxide Compositions

The invention relates to vanadium-free, tellurium-free lead-tungsten-based oxide (Pb—W—O) compositions. In one embodiment, the Pb—W—O consists of lead oxide and tungsten oxide, that is, 75-88 wt % PbO and 12-25 wt % $WO_3$. In another embodiment, the Pb—W—O may contain one or more additional oxides. Thus the Pb—W—O comprises lead oxide, tungsten oxide, and an additional oxide, that is, 55-88 wt % PbO, 12-25 wt % $WO_3$ and 0-20 wt % of one or more additional oxides selected from the group consisting of $B_2O_3$, $Bi_2O_3$, $SiO_2$, $Al_2O_3$, $Li_2O$, $K_2O$, $Rb_2O$, $Na_2O$, $Cs_2O$ and $MoO_3$. All wt % are based on the total weight of the Pb—W—O and represent the starting mixture of oxides.

As used herein, "vanadium-free, tellurium-free" means that no vanadium or tellurium is intentionally added to the lead-tungsten-based oxide, Any vanadium or tellurium present is introduced only as an impurity in one of the components of the thick-film paste.

In an embodiment, the lead of the Pb—W—O may be from lead oxides, lead salts, metallic lead, or organometallic lead. In a further embodiment, lead oxide can be PbO, $PbO_2$, $Pb_3O_4$, $Pb_2O_3$, $Pb_{12}O_{19}$, or the like. In a still further embodiment, the lead oxide can be coated for example by silica or $SiO_2$, In a further embodiment, the lead salts can be lead halides such as $PbCl_2$ or $PbBr_2$ or lead fluoride such as $PbF_2$. In a further embodiment, the metallic lead may be Pb or alloys such as Pb—W or Pb—Sn. In a further embodiment, organometallic lead may be lead resinate such as lead 2-ethylhexanoate ($Pb(C_2H_{15}O_2)_2$), lead octoate ($Pb[CH_3(CH_2)_3CH(C_2H_5)COO]_2$), or lead oxalate ($PbC_2O_4$).

In an embodiment, the tungsten of the Pb—W—O may be from tungsten oxide, tungsten salts, metallic tungsten, or organometallic tungsten. The tungsten oxide can be $WO_3$ or $WO_2$. In a further embodiment, the tungsten may be an inorganic tungsten compound or an organic tungsten compound.

In an embodiment, the Pb—W—O may be a glass composition. In a further embodiment, the Pb—W—O may be crystalline, partially crystalline, amorphous, partially amorphous, or combinations thereof. In an embodiment, the Pb—W—O composition may include more than one glass composition. In an embodiment, the Pb—W—O composition may include a glass composition and an additional composition, such as a crystalline composition. Herein, all these compositions are referred to as glasses or glass frits.

The lead-tungsten-oxide (Pb—W—O) may be prepared by mixing PbO or $Pb_3O_4$, $WO_3$, and any of the one or more additional oxides or other materials that decompose into the desired oxides when heated using techniques understood by one of ordinary skill in the art. Such preparation techniques may involve heating the mixture in air or an oxygen-containing atmosphere to form a melt, quenching the melt, and grinding, milling, and/or screening the quenched material to provide a powder with the desired particle size. Melting the mixture of is typically conducted at a peak temperature of 800 to 1200° C. The molten mixture can be quenched, for example, on a stainless steel platen or between counter-rotating stainless steel rollers to form a platelet. The resulting platelet can be milled to form a powder. Typically, the milled powder has a $D_{50}$ of 0.1 to 3.0 microns. One skilled in the art of producing glass frit may employ alternative synthesis techniques such as but not limited to water quenching, sol-gel, spray pyrolysis, or others appropriate for making powder forms of glass.

In one embodiment, the Pb—W—O comprises lead oxide and tungsten oxide, that is, 80-85 wt % PbO and 15-20 wt % $WO_3$.

In another embodiment, the starting mixture used to make the Pb—W—O comprises, 55-88 wt % PbO, 12-25 wt % $WO_3$ and 0-20 wt % of one or more additional oxides selected from the group consisting of $B_2O_3$, $Bi_2O_3$, $SiO_2$, $Al_2O_3$, $Li_2O$, $K_2O$, $Rb_2O$, $Na_2O$, $Cs_2O$ and $MoO_3$, wherein the wt % are based on the total weight of the lead-tungsten-based oxide. In one such embodiment, the one or more additional oxides are selected from the group consisting of 0-5 wt % $B2O_3$, 0-10 wt % $Bi_2O_3$, 0-15 $SiO_2$, 0-5 wt % $Al_2O_3$, 0-5 wt % $Li_2O$, 0-5 wt % $K_2O$, 0-5 wt % $Rb_2O$, 0-5 wt % $Na_2O$, 0-5 wt % $Cs_2O$, and 0-10 $MoO_3$, wherein the oxide wt % are based on the total weight of the lead-tungsten-based oxide and represent the starting mixture of oxides.

In one embodiment, the thick-film paste composition comprises 0.5 to 20 wt % of the vanadium-free, tellurium-free lead-tungsten-based oxide, wherein the wt % is based on the total weight of the source of electrically conductive metal and the vanadium-free, tellurium-free lead-tungsten-based oxide. In another embodiment, the thick-film paste composition comprises 1 to 10 wt % of the vanadium-free, tellurium-free lead-tungsten-based oxide, wherein the wt % is based on the total weight of the source of electrically conductive metal and the vanadium-free, tellurium-free lead-tungsten-based oxide.

In an embodiment, the Pb—W—O may be a homogenous powder. In a further embodiment, the Pb—W—O may be a combination of more than one powder, wherein each powder may separately be homogenous. The composition of the overall combination of the multiple powders is within the ranges described above. For example, the Pb—W—O may include a combination of two or more different powders; separately, these powders may have different compositions, and may or may not be within the ranges described above; however, the combination of these powders is within the ranges described above.

Glass compositions, also termed glass frits, are described herein as including percentages of certain components. Specifically, the percentages are the percentages of the components used in the starting material that was subsequently processed as described herein to form a glass composition. Such nomenclature is conventional to one of skill in the art. In other words, the composition contains certain components, and the percentages of those components are expressed as a percentage of the corresponding oxide form. As indicated above the Pb and W may be supplied by various sources such as oxides, halides, carbonates, nitrates, phosphates, hydroxides, peroxides, halogen compounds and mixtures thereof. Similarly with the components of the one or more additional oxides. Herein, the composition of the lead-tungsten-based oxide is given in terms of the equivalent oxides no matter the source of the various components. As recognized by one of ordinary skill in the art in glass chemistry, a certain portion of volatile species may be released during the process of making the glass. An example of a volatile species is oxygen.

If starting with a fired glass, one of ordinary skill in the art may calculate the percentages of starting components described herein using methods known to one of skill in the art including, but not limited to: Inductively Coupled Plasma-Emission Spectroscopy (ICPES), Inductively Coupled Plasma-Atomic Emission Spectroscopy (ICP-AES), and the like. In addition, the following exemplary techniques may be used: X-Ray Fluorescence spectroscopy (XRF); Nuclear Magnetic Resonance spectroscopy (NMR); Electron Paramagnetic Resonance spectroscopy (EPR); Mössbauer spectroscopy; electron microprobe Energy Dispersive Spectroscopy (EDS); electron microprobe Wavelength Dispersive Spectroscopy (WDS); Cathodo-Luminescence (CL).

One of ordinary skill in the art would recognize that the choice of raw materials could unintentionally include impurities that may be incorporated into the glass during processing. For example, the impurities may be present in the range of hundreds to thousands ppm. The presence of the impurities would not alter the properties of the glass, the thick-film composition, or the fired device. For example, a solar cell containing the thick-film composition may have the efficiency described herein, even if the thick-film composition includes impurities.

Organic Medium

The inorganic components of the thick-film paste composition are mixed with an organic medium to form viscous pastes having suitable consistency and rheology for printing. A wide variety of inert viscous materials can be used as the organic medium. The organic medium can be one in which the inorganic components are dispersible with an adequate degree of stability during manufacturing, shipping, and storage of the pastes, as well as on the printing screen during the screen-printing process. Suitable organic media have rheological properties that provide stable dispersion of solids, appropriate viscosity and thixotropy for screen printing, appropriate wettability of the substrate and the paste solids, a good drying rate, and good firing properties. The organic medium can contain thickeners, stabilizers, surfactants, and/or other common additives. The organic medium can be a solution of polymer(s) in solvent(s). Suitable polymers include ethyl cellulose, ethylhydroxyethyl cellulose, wood rosin, cellulose esters, mixtures of ethyl cellulose and phenolic resins, polymethacrylates of lower alcohols, and the monobutyl ether of ethylene glycol monoacetate. Suitable solvents include terpenes such as alpha- or beta-terpineol or mixtures thereof with other solvents such as kerosene, dibutylphthalate, butyl carbitol, butyl carbitol acetate, hexylene glycol and alcohols with boiling points above 150° C., and alcohol esters. Other suitable organic medium components include: bis(2-(2-butoxyethoxy)ethyl adipate, dibasic esters such as DBE, DBE-2, DBE-3, DBE-4, DBE-5, DBE-6, DBE-9, and DBE 1B, octyl epoxy tallate, isotetradecanol, and pentaerythritol ester of hydrogenated rosin. The organic medium can also include volatile liquids to promote rapid hardening after application of the thick-film paste composition on a substrate. The optimal amount of organic medium in the thick-film paste composition is dependent on the method of applying the paste and the specific organic medium used. Typically, the thick-film paste composition contains 70 to 95 wt % of inorganic components and 5 to 30 wt % of organic medium.

If the organic medium includes a polymer, the polymer may include 8 to 15 wt % of the organic medium.

Preparation of the Thick-Film Paste Composition and its Use In one embodiment, the thick-film paste composition can be prepared by mixing the conductive metal powder, the Pb—W—O powder, and the organic medium in any order. In an embodiment, the thick-film paste composition may also include two powders of Pb—W—O. In some embodiments, the inorganic materials are mixed first, and they are then added to the organic medium. The viscosity can be adjusted, if needed, by the addition of one or more solvents. Mixing methods that provide high shear may be useful. In an embodiment, the thick-film paste may include lead-tungsten-based oxide in an amount of 0.5 to 20 wt %, 0.5 to 15 wt %, 0.5 to 7 wt %, or 1 to 3% by weight based on the total weight of the solids.

One aspect of the present invention is a process comprising:

(a) providing an article comprising one or more insulating films disposed onto at least one surface of a semiconductor substrate;

(b) applying a thick-film paste composition onto the one or more insulating films to form a layered structure, the thick-film paste composition comprising:

i) 80-99.5 wt % of a source of electrically conductive metal;

ii) 0.5 to 20 wt % of a vanadium-free, tellurium-free lead-tungsten-based oxide; and iii) an organic medium, wherein the source of electrically conductive metal and the lead-tungsten-based oxide are dispersed in the organic medium and wherein the above wt % are based on the total weight of the source of electrically conductive metal and the vanadium-free, tellurium-free lead-tungsten-based oxide, the vanadium-free, tellurium-free lead-tungsten-based oxide comprising 55-88 wt % PbO, 12-25 wt % $V_2O_5$ and 0-20 wt % of one or more additional oxides selected from the group consisting of 0-5 wt % $B_2O_3$, 0-10 wt % $Bi_2O_3$, 0-15 $SiO_2$, 0-5 wt % $Al_2O_3$, 0-5 wt % $Li_2O$, 0-5 wt % $K_2O$, 0-5 wt % $Rb_2O$, 0-5 wt % $Na_2O$, 0-5 wt % $Cs_2O$, and 0-10 $MoO_3$, wherein the oxide wt % are based on the total weight of the vanadium-free, tellurium-free lead-tungsten-based oxide; and (c) firing the semiconductor substrate, the one or more insulating films, and the thick-film paste wherein the organic medium of the thick film paste is volatilized, thereby forming an electrode in contact with the one or more insulating layers and in electrical contact with the semiconductor substrate.

In one embodiment, a semiconductor device is manufactured from an article comprising a junction-bearing semiconductor substrate and a silicon nitride insulating film formed on a main surface thereof. The process includes the steps of applying (for example, coating or screen-printing) onto the insulating film, in a predetermined shape and thickness and at a predetermined position, a thick-film paste composition having the ability to penetrate the insulating layer, then firing so that thick-film paste composition reacts with the insulating film and penetrates the insulating film, thereby effecting electrical contact with the silicon substrate.

One embodiment of this process is illustrated in FIGS. 1A-1F.

FIG. 1A shows a mono-crystal silicon or multi-crystalline silicon p-type substrate 10.

Figure 1B:
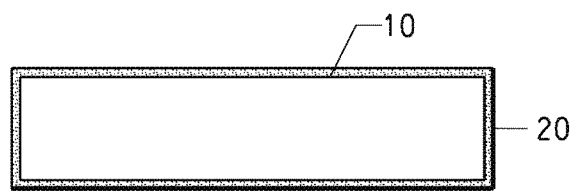

In FIG. 1B, an n-type diffusion layer 20 of the reverse polarity is formed to create a p-n junction. The n-type diffusion layer 20 can be formed by ion implantation or thermal diffusion of phosphorus (P) using phosphorus oxychloride ($POCl_3$) as the phosphorus source. In the absence of any particular modifications, the n-type diffusion layer 20 is formed over the entire surface of the silicon p-type substrate, The depth of the diffusion layer can be varied by controlling the diffusion temperature and time, and is generally formed in a thickness range of about 0.3 to 0.75 microns, The n-type diffusion layer may have a sheet resistivity of several tens of ohms per square up to about 120 ohms per square.

Figure 1C:
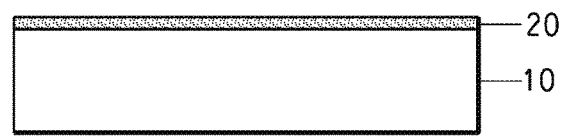

After protecting one surface of the n-type diffusion layer 20 with a resist or the like, as shown in FIG. 1C, the n-type diffusion layer 20 is removed from most surfaces by etching so that it remains only on one main surface. The resist is then removed using an organic solvent or the like.

Figure 1D:
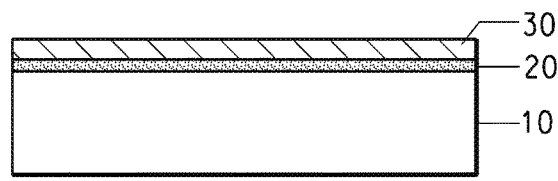

Next, in FIG. 1D, an insulating layer 30 which also functions as an anti-reflection coating is formed on the n-type diffusion layer 20. The insulating layer is commonly silicon nitride, but can also be a $SiN_x$:H film (i.e., the insulating film includes hydrogen for passivation during subsequent firing processing), a titanium oxide film, a silicon oxide film, or a silicon oxide/titanium oxide film. A thickness of about 700 to 900 Å of a silicon nitride film is suitable for a refractive index of about 1.9 to 2.0. Deposition of the insulating layer 30 can be by sputtering, chemical vapor deposition, or other methods.

Figure 1E:
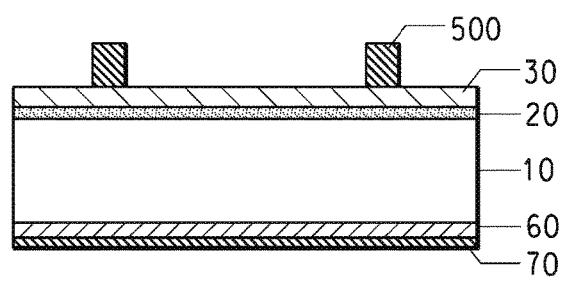

Next, electrodes are formed. As shown in FIG. 1E, a thick-film paste composition of this invention is screen-printed on the insulating film 30, and then dried. In addition, aluminum paste 60 and back-side silver paste 70 are screen-printed onto the back side of the substrate, and successively dried. Firing is carried out at a temperature of 750 to 850° C. for a period of from several seconds to several tens of minutes.

Figure 1F:
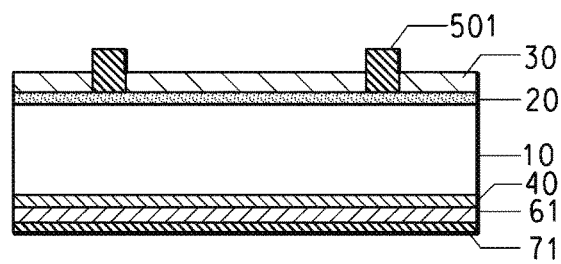

Consequently, as shown in FIG. 1F, during firing, aluminum diffuses from the aluminum paste into the silicon substrate on the back side, thereby forming a p+ layer 40, containing a high concentration of aluminum dopant. This layer is generally called the back surface field (BSF) layer, and helps to improve the energy conversion efficiency of the solar cell. Firing converts the dried aluminum paste 60 to an aluminum back electrode 61. The back-side silver paste 70 is fired at the same time, becoming a silver or silver/aluminum back electrode 71. During firing, the boundary between the back-side aluminum and the back-side silver assumes the state of an alloy, thereby achieving electrical connection. Most areas of the back electrode are occupied by the aluminum electrode, owing in part to the need to form a p+ layer 40. At the same time, because soldering to an aluminum electrode is impossible, the silver or silver/aluminum back electrode is formed on limited areas of the back side as an electrode for interconnecting solar cells by means of copper ribbon or the like.

On the front side, the thick-film paste composition 500 of the present invention sinters and penetrates through the insulating film 30 during firing, and thereby achieves electrical contact with the n-type diffusion layer 20. This type of process is generally called "fire through." This fired-through state, Le., the extent to which the paste melts and passes through the insulating film 30, depends on the quality and thickness of the insulating film 30, the composition of the paste, and on the firing conditions. When fired, the paste 500 becomes the electrode 501, as shown in FIG. 1F. In one embodiment, the insulating film is selected from titanium oxide, aluminum oxide, silicon nitride, $SiN_x$:H, silicon oxide, and silicon oxide/titanium oxide films. The silicon nitride film can be formed by sputtering, plasma-enhanced chemical vapor deposition (PECVD), or a thermal CVD process. In one embodiment, the silicon oxide film is formed by thermal oxidation, sputtering, or thermal CVD or plasma CVD. The titanium oxide film can be formed by coating a titanium-containing organic liquid material onto the semiconductor substrate and firing, or by a thermal CVD.

In embodiments of this process, the semiconductor substrate can be single-crystal or multi-crystalline silicon.

Suitable insulating films include one or more components selected from: aluminum oxide, titanium oxide, silicon nitride, $SiN_x$:H, silicon oxide, and silicon oxide/titanium oxide. In one embodiment of the invention, the insulating film is an anti-reflection coating (ARC). The insulating film can be applied to a semiconductor substrate, or it can be naturally forming, such as in the case of silicon oxide.

In one embodiment, the insulating film includes a layer of silicon nitride. The silicon nitride can be deposited by CVD (chemical vapor deposition), PECVD (plasma-enhanced chemical vapor deposition), sputtering, or other methods.

In one embodiment, the silicon nitride of the insulating layer is treated to remove at least a portion of the silicon nitride. The treatment can be a chemical treatment. The removal of at least a portion of the silicon nitride may result in an improved electrical contact between the conductor of the thick-film paste composition and the semiconductor substrate. This may result in improved efficiency of the semiconductor device.

In one embodiment, the silicon nitride of the insulating film is part of an anti-reflective coating.

The thick-film paste composition can be printed on the insulating film in a pattern, e.g., bus bars with connecting lines. The printing can be by screen-printing, plating, extrusion, inkjet, shaped or multiple printing, or ribbons.

In this electrode-forming process, the thick-film paste composition is heated to remove the organic medium and sinter the metal powder. The heating can be carried out in air or an oxygen-containing atmosphere. This step is commonly referred to as "firing." The firing temperature profile is typically set so as to enable the burnout of organic binder materials from dried thick-film paste composition, as well as any other organic materials present. In one embodiment, the firing temperature is 750 to 950° C. The firing can be conducted in a belt furnace using high transport rates, for example, 100-500 cm/min, with resulting hold-up times of 0.05 to 5 minutes. Multiple temperature zones, for example 3 to 11 zones, can be used to control the desired thermal profile.

Upon firing, the electrically conductive metal and Pb—W—O mixture penetrate the insulating film. The penetration of the insulating film results in an electrical contact between the electrode and the semiconductor substrate. After firing, an interlayer may be formed between the semiconductor substrate and the electrode, wherein the interlayer includes one or more of tungsten, tungsten compounds, lead, lead compounds, and silicon compounds, where the silicon may originate from the silicon substrate and/or the insulating layer(s). After firing, the electrode includes sintered metal that contacts the underlying semiconductor substrate and may also contact one or more insulating layers.

Another aspect of the present invention is a semiconductor device comprising an electrode formed from a thick-film paste composition comprising:

i) 80-99.5 wt % of a source of electrically conductive metal;
ii) 0.5 to 20 wt % of a vanadium-free, tellurium-free lead-tungsten-based oxide; and
iii) an organic medium, wherein the source of electrically conductive metal and the lead-tungsten-based oxide are dispersed in the organic medium and wherein the above wt % are based on the total weight of the source of electrically conductive metal and the vanadium-free, tellurium-free lead-tungsten-based oxide, the vanadium-free, tellurium-free lead-tungsten-based oxide comprising 55-88 wt % PbO, 12-25 wt % $V_2O_5$ and 0-20 wt % of one or more additional oxides selected from the group consisting of 0-5 wt % $B_2O_3$, 0-10 wt % $Bi_2O_3$, 0-15 $SiO_2$, 0-5 wt % $Al_2O_3$, 0-5 wt % $Li_2O$, 0-5 wt % $K_2O$, 0-5 wt % $Rb_2O$, 0-5 wt % $Na_2O$, 0-5 wt % $Cs_2O$, and 0-10 $MoO_3$, wherein the oxide wt % are based on the total weight of the vanadium-free, tellurium-free lead-tungsten-based oxide and wherein said thick film paste composition has been fired to remove the organic medium and form said electrode.

In one embodiment, the electrode is a front-side electrode on a silicon solar cell. In one embodiment, the device further includes a back electrode.

Lightly Doped Emitter (LDE) Wafers

Si solar cells are made by adding controlled impurities (called dopants) to purified Si. Different dopants impart positive (p-type) and negative (n-type) semiconducting properties to the Si. The boundary (junction) between the p-type and n-type Si has an associated (built in) voltage that provides power to electrical charge carriers in the solar cell. Dopant concentration must be controlled to achieve optimal cell performance. High dopant concentration imparts low electrical resistivity within the Si and at the Si surface (to metal contacts) decreasing resistance losses. It also introduces crystalline defects or electrical perturbations in the Si lattice that increase recombination losses.

The most common Si solar cell design consists of a 200 micron thick p-type Si wafer coated with a 0.4 micron layer n-type Si. The p-type wafer is the base. The n-type layer is the emitter. It is made by either diffusion or ion implantation of phosphorous (P) dopant into the Si wafer. Emitters made with low dopant concentration at the wafer surface are called lightly (or lowly) doped emitters.

The lightly doped emitter (LDE) improves solar cell performance by decreasing electron-hole recombination at the front surface. The concentration of P dopant at the front surface ($[P_{surface}]$) above $\sim 1 \times 10^{20}$ atoms/cm$^3$ in Si leads to various types of recombination. Recombined charge carriers are bound to the Si lattice and unable to be collected as electrical energy. The solar cell energy loss results from a decrease of both Voc (open circuit voltage) and Isc (short circuit current).

Typical highly doped Si emitters (NDE) have total $[P_{surface}]$ ranging from 9 to $15 \times 10^{20}$ atoms/cm$^3$ and active $[P_{surface}]$ ranging from 3 to $4 \times 10^{20}$ atoms/cm$^3$. Lightly doped emitters have total $[P_{surface}]$ ranging from 0.9 to $2.9 \times 10^{20}$ atoms/cm$^3$ and active $[P_{surface}]$ ranging from 0.6 to $2.0 \times 10^{20}$ atoms/cm$^3$. P dopant in excess of the active concentration (Inactive P) leads to Shockley-Read-Hall (SRH) recombination energy loss. Active P dopant above $1 \times 10^{20}$ atoms/cm$^3$ leads to Auger recombination energy loss.

Total dopant concentration is typically measured using the SIMS (secondary ion mass spectrometry) depth profiling method. [Diffusion in Silicon, S. W. Jones, IC Knowledge LLC 2008 pages 56-62, see page 61]. Active dopant concentration is often measured using SRP (spreading resistance probing) [Diffusion in Silicon, op. cit., page 61] or ECV (electrochemical capacitance voltage [Diffusion in Silicon, op. cit., page 57] methods.

Metal contacts to lightly doped emitters have larger energy barriers to charge carrier tunneling than contacts to highly doped emitters. The larger barriers decrease tunneling current and increase contact resistivity. The high contact resistance to LDE is decreased by increasing contact area with improved interfacial film nanostructure.

EXAMPLES

Illustrative preparations and evaluations of vanadium-free, tellurium-free lead-tungsten-based oxides and thick-film paste compositions are described below.

Examples 1-3

A Pb—W—O was prepared in the following manner. 41.49 g of PbO and 8.51 g of $WO_3$ were rolled in a glass jar for 15 minutes to mix well. The powder was then packed into a Pt crucible with a lid and heated to 900° C. for 1 hour. The sample, fully molten, was poured out onto a stainless steel quench block. After cooling, the button was ground to -100 mesh and milled in IPA to a median particle size of 0.39 micron. The powder was isolated, dried, and sieved to -230 mesh to provide the Pb—W—O containing 82.98 wt % PbO and 17.02 wt % $WO_3$.

A 50 g batch of silver paste was made for Example 1 by placing 43.51 of silver powder in a glass jar to which was added 0.50 g of the Pb—W—O glass frit powder prepared as described above. The powders were then tumble-mixed for about 15 min. An organic medium was prepared by mixing the components listed in Table 1 in a plastic jar using a THINKY® ARE-310 planetary centrifugal mixer (THINKY USA, Inc., Laguna Hills, Calif.).

TABLE 1

Composition of the organic medium

| Component | Weight Fraction |
|---|---|
| 50-52% ethoxyl ethyl cellulose resin, 11 wt. % in Texanol ® | 13.98% |
| 48-50% ethoxyl ethyl cellulose resin, 8 wt. % in Texanol ® | 5.38% |
| Amine oleate surfactant | 10.75% |
| Foralyn (hydrogenated rosin ester), 50 wt % dissolved in Texanol ® | 26.88% |
| Hydrogenated castor oil derivative | 5.38% |
| Dibasic ester-3 | 37.63% |

To 4.66 g of this organic medium, approximately one third of the silver and Pb—W—O glass frit powder mixture was added and mixed using the THINKY® mixer for 30 seconds at 2000 rpm. This step was repeated with the second and third portions of the silver and 43.51 Pb—W—O glass frit powder mixture, making sure the powder was thoroughly dispersed in the medium. The dispersed mixture was then blended with a three-roll mill (Charles Ross & Son Company, Floor Model, with 4" x 8" rollers) at a 1 mil gap for three passes at zero psi and three passes at 100 psi. The paste comprises 98.86 wt % Ag and 1.14 wt % Pb—W—O wherein the wt % are based on the total weight of the Ag and the Pb—W—O.

After letting the paste sit overnight, the paste's viscosity was measured using a Brookfield HADV-I Prime viscometer (Brookfield Engineering Laboratories, Inc., Middleboro, Mass.) with the thermostatted small-sample adapter held at 25° C. The viscosity of the paste was adjusted with Texanol® to obtain a printable paste, with a 10 rpm viscosity of approximately 300 Pa-s.

The procedure above produced a paste composition for Example 1 containing nominally 1 wt % of the Pb—W—O glass frit, based on the total weight of the paste composition. Pastes with 2 and 3 wt % Pb—W—O glass frit for Examples 2 and 3, respectively, were prepared in a similar manner by replacing some of the silver powder with glass frit powder.

Solar cells for testing the performance of the thick-film pastes were made using 175 micron-thick multi-crystalline silicon wafers (Q-Cells, Bitterfeld-Wolfen, Germany) with a 65 ohm/sq. phosphorus-doped emitter layer which had an acid-etched textured surface and a 70-80 nm thick PECVD $SiN_x$ anti-reflective coating. The wafers were cut into 28 mm×28 mm cells using a diamond wafering saw, The back sides of the cells were screen-printed with a full ground-plane of commercial aluminum paste, PV381 (E. L du Pont de Nemours and Company, Wilmington, Del.) for back-side contact. After printing, the aluminum paste was dried in a mechanical convection oven with vented exhaust for 30 minutes at 150° C., resulting in a dried film thickness of 25 to 30 microns.

The pastes of the invention were screen-printed using an MSP 485 screen printer (Affiliated Manufacturers, Inc.) on the silicon nitride layer on the front surface of the silicon cells and dried at 150° C. for 30 minutes in a convection oven to give 25 to 30 microns thick finger lines and a bus bar. The screen-printed silver paste had a pattern of eleven finger lines of ~110 microns width, connected to a bus bar of 1.25 mm width located near one edge of the cell (screen parameters: 1.2 mil emulsion; 325 mesh, 0.9 mil wire; 30° angle; 100µ finger line width nominal opening).

The dried cells were fired in a 4-zone furnace (BTU International, North Billerica, Mass.; Model PV309) at a belt speed of 221 cm/min, with the following furnace set point temperatures: zone 1 at 610° C., zone 2 at 610° C., zone 3 at 585° C., and the final zone 4 set at a series of five temperatures from 900° C. to 940° C. The cells took about 5.2 sec to pass through zone 4. For each paste composition, 25 cells were printed. 5 cells were fired at each temperature. The reported cell data is the median value for each measured parameter taken from the set of 5 cells fired at the optimal temperature.

A commercial current-voltage (JV) tester (ST-1000, Telecom-STV Ltd., Moscow, Russia) was used to make efficiency measurements of the polycrystalline silicon photovoltaic cells. Two electrical connections, one for voltage and one for current, were made on the top and the bottom of each of the photovoltaic cells. Transient photo-excitation was used to avoid heating the silicon photovoltaic cells and to obtain JV curves under standard temperature conditions (25° C.). A flash lamp with a spectral output similar to the solar spectrum illuminated the photovoltaic cells from a vertical distance of 1 m. The lamp power was held constant for 14 milliseconds. The intensity at the sample surface, as calibrated against external solar cells was 1000 W/m² (or 1 Sun) during this time period. During the 14 milliseconds, the JV tester varied an artificial electrical load on the sample from short circuit to open circuit. The JV tester recorded the light-induced current through, and the voltage across, the photovoltaic cells while the load changed over the stated range of loads. A power versus voltage curve was obtained from this data by taking the product of the current times the voltage at each voltage level. The maximum of the power versus voltage curve was taken as the characteristic output power of the solar cell for calculating solar cell efficiency. This maximum power was divided by the area of the sample to obtain the maximum power density at 1 Sun intensity, This was then divided by 1000 W/m² of the input. intensity to obtain the efficiency which is then multiplied by 100 to present the result in percent. Other parameters of interest were also obtained from this same current-voltage curve. One such parameter is fill factor (FF), which is obtained by taking the ratio of the maximum power from the solar cell to the product of open circuit voltage and short circuit current. For reasonably efficient cells, an estimate ($R_a$) of the series resistance ($R_{series}$) was obtained from the reciprocal of the local slope of the current voltage curve near the short circuit point.

Median values for optimum cell efficiency, fill factor (FF), and series resistance ($R_a$) for solar cells prepared using the thick-film pastes described above are summarized in Table 2.

TABLE 2

| | Cell Performance | | | |
|---|---|---|---|---|
| | Pb—W—O | | | |
| Example | Loading (wt %) | Efficiency (%) | FF (%) | $R_a$ (ohms) |
| 1 | 1 | 13.53 | 69.5 | 0.3498 |
| 2 | 2 | 14.76 | 76.0 | 0.2041 |
| 3 | 3 | 14.30 | 74.2 | 0.1988 |

Examples 4-11

Lead-tungsten-based oxide (Pb—W—O) compositions of the invention were prepared as described in Examples 1-3 using PbO and $WO_3$ in Example 4 and PbO, $WO_3$ and one or more of $B_2O_3$, $Bi_2O_3$, and $Li_2O$ in the amounts shown in Table 3 wherein the weight percents are based on the total weight of lead-tungsten-based oxide.

The solar cells for testing the performance of the thick-film pastes were made using mono-crystalline silicon wafers (Gintech Energy Corp.Taiwan). 2.00 wt % of Pb—W—O was used in the paste compositions of all these Examples.

Median values for optimum cell efficiency (Eff.), fill factor (FF), and series resistance ($R_a$) for solar cells prepared using the thick-film pastes described above are summarized in Table 3.

TABLE 3

Pb—W—O Composition and Cell Performance

| Example | PbO (wt %) | WO$_3$ (wt %) | B$_2$O$_3$ (wt %) | Bi$_2$O$_3$ (wt %) | Li$_2$O (wt %) | Eff. (%) | FF (%) | R$_a$ (ohms) |
|---|---|---|---|---|---|---|---|---|
| 4 | 82.80 | 17.20 | 0.00 | 0.00 | — | 14.54 | 67.9 | 0.2685 |
| 5 | 82.13 | 17.06 | 0.81 | 0.00 | 0.00 | 14.21 | 66.6 | 0.2897 |
| 6 | 78.51 | 16.31 | 0.00 | 5.18 | 0.00 | 14.30 | 66.9 | 0.3024 |
| 7 | 82.51 | 17.14 | 0.00 | 0.00 | 0.35 | 7.24 | 49.0 | 0.3005 |
| 8 | 77.65 | 16.14 | 0.81 | 5.40 | 0.00 | 13.69 | 65.2 | 0.3253 |
| 9 | 81.79 | 16.99 | 0.85 | 0.00 | 0.37 | 14.13 | 67.7 | 0.2718 |
| 10 | 78.01 | 16.21 | 0.00 | 5.43 | 0.35 | 13.76 | 65.0 | 0.2793 |
| 11 | 77.09 | 16.02 | 0.85 | 5.68 | 0.36 | 14.22 | 67.0 | 0.2817 |

Examples 12-24

Lead-tungsten-based oxide (Pb—W—O) compositions of the invention were prepared by mixing and blending Pb$_3$O$_4$ and WO$_3$ and one or more additional oxides selected from the group consisting of SiO$_2$, Al$_2$O$_3$, Li$_2$O, K$_2$O, Rb$_2$O, NaO, Cs$_2$O and MoO$_3$, as shown in Tables 4, 5 and 6. This list is meant to be illustrative, not limiting. In Tables 4, 5 and 6, the amounts of the compounds are shown as weight percent, based on the weight of the total glass composition.

The blended powder batch materials were loaded into a platinum alloy or ceramic crucible and then inserted into a furnace at 909-1199° C. using an air- or O$_2$-containing atmosphere. The duration of the heat treatment was 20 minutes following the attainment of a full solution of the constituents. The resulting low viscosity liquid resulting from the fusion of the constituents was then quenched by metal roller. The quenched glass was then milled, and screened to provide a powder with a D$_{50}$ of 0.1 to 3.0 microns. The compositions in Table 4 are displayed as weight percent of the various oxides, based on the weight of the total glass composition.

TABLE 4

Pb—W—O Composition

| Example | PbO (wt %) | WO$_3$ (wt %) | SiO$_2$ (wt %) | Al$_2$O$_3$ (wt %) | Li$_2$O (wt %) | K$_2$O (wt %) | Rb$_2$O (wt %) |
|---|---|---|---|---|---|---|---|
| 12 | 75.37 | 15.45 | 4.83 | 1.91 | 0.32 | 0.11 | 2.01 |
| 13 | 79.33 | 16.26 | 1.36 | 0.58 | 0.34 | 0.02 | 2.11 |
| 14 | 78.76 | 16.15 | 1.75 | 0.87 | 0.34 | 0.04 | 2.10 |
| 15 | 75.29 | 15.44 | 4.83 | 1.91 | 0.42 | 0.11 | 2.00 |
| 16 | 72.90 | 14.96 | 7.59 | 1.85 | 0.63 | 0.09 | 1.98 |
| 17 | 87.17 | 14.24 | 13.09 | 2.95 | 0.59 | 0.14 | 1.83 |
| 18 | 76.73 | 15.94 | 0.72 | 1.09 | 1.06 | 0.06 | 4.41 |

TABLE 5

Pb—W—O Composition

| Example | PbO (wt %) | WO$_3$ (wt %) | SiO$_2$ (wt %) | Al$_2$O$_3$ (wt %) | Li$_2$O (wt %) | K$_2$O (wt %) | Na$_2$O (wt %) | Cs$_2$O (wt %) |
|---|---|---|---|---|---|---|---|---|
| 19 | 79.66 | 16.88 | 1.13 | 0.57 | 0.69 | 0.03 | 1.03 | 0.00 |
| 20 | 77.98 | 16.53 | 1.07 | 0.52 | 0.68 | 0.02 | 0.00 | 3.20 |

TABLE 6

Pb—W—O Composition

| Example | PbO (wt %) | WO$_3$ (wt %) | SiO$_2$ (wt %) | Al$_2$O$_3$ (wt %) | Li$_2$O (wt %) | K$_2$O (wt %) | Rb$_2$O (wt %) | MoO$_3$ (wt %) |
|---|---|---|---|---|---|---|---|---|
| 21 | 77.21 | 16.36 | 2.00 | 1.56 | 0.67 | 2.19 | 0.00 | 0.00 |
| 22 | 75.68 | 15.72 | 3.95 | 1.34 | 1.04 | 0.09 | 2.17 | 0.00 |
| 23 | 73.02 | 14.22 | 3.28 | 1.11 | 0.33 | 0.19 | 0.00 | 7.85 |
| 24 | 82.08 | 16.85 | 0.00 | 0.00 | 1.07 | 0.00 | 0.00 | 0.00 |

Examples 25-41

Paste compositions of the invention corresponding to Examples Number 25-41 were prepared using the following procedure. An organic medium was prepared placing the components listed in Table 7 into a plastic jar. Then a stirring bar was placed in the jar and the mixture was stirred for 1 hr until all ingredients were well blended.

TABLE 7

Composition of the organic medium

| Component | Wt. % |
|---|---|
| 2,2,4-trimethyl-1,3-pentanediol monoisobutyrate | 5.57 |
| Ethyl Cellulose (50-52% ethoxyl) | 0.14 |
| Ethyl Cellulose (48-50% ethoxyl) | 0.04 |
| N-tallow-1,3-diaminopropane dioleate | 1.00 |
| Hydrogenated castor oil | 0.50 |
| Pentaerythritol tetraester of perhydroabietic acid | 1.25 |
| Dimethyl adipate | 3.15 |
| Dimethyl glutarate | 0.35 |

1-3.5 wt. % Pb—W—O glass frit (based on the total weight of the paste composition) from one of the P—W—O glass compositions of Examples 25-41 and shown in Tables 4, 5 or 6 was added to the organic mixture of Table 7. 87.35-89.35 wt % Ag powder was added incrementally to ensure good wetting. After all ingredients were well mixed by hand or table mixer, the mixture was put into Thinky mixer for 1-3 min at 1000 rpm. The mixture was then repeatedly passed through a 3-roll mill at progressively increasing pressures from 0 to 250 psi. The gap of the rolls was set to 2 mils. The degree of dispersion was measured by fineness of grind (FOG). A typical FOG value for a paste was less than 10 microns for the fourth longest, continuous scratch and less than 5 microns for the point at which 50% of the paste was scratched.

The paste viscosity was measured using a Brookfield viscometer (Brookfield, Inc., Middleboro, Mass.) with a #14 spindle and a #6 cup, The viscosity of the paste was measured after 12-24 hrs at room temperature. Viscosity was measured after 3 minutes at 10 RPM in a viscometer and the paste viscosity was adjusted to between 270-340 Pa•s by adding solvent and medium and then mixing for less than one minute at 1000 RPM. This step was repeated until the desired viscosity was achieved.

Solar cells for testing the performance of the thick-film pastes of the invention prepared as described above were made using 200 micron thick multi-crystalline silicon wafers with a 65-68 Ω/□ phosphorous-doped p-type emitter layer. Those multi-crystalline wafers were obtained from Gintech Energy Corporation, Taiwan or DeutscheCell, Germany. The solar cells used were textured by isotropic acid etching and had an anti-reflection coating (ARC) of $SiN_x$:H. Wafers of 6 inch square were used to measure the efficiency and fill factor for each sample.

Each sample was made by screen-printing using an MicroTek printer set with a squeegee speed of 100-250 mm/sec. The screen used for a 6 inch square multi-crystalline wafer had a pattern of 31 finger lines with a 40 or 60 µm opening. All patterns had three bus bars with a 1.5 mm opening on a 15 µm or a 20 µm emulsion in a screen with 350-360 mesh and 16-23 µm wires, An experimental Al paste was printed on the non-illuminated (back) side of the device.

After each side was printed, the device with the printed patterns was dried for 10-15 minutes in a drying oven with a 150° C. peak temperature. The substrates were then fired front up with a CF7214 Despatch 6-zone IR furnace using a 560 cm/min belt speed and the first five zones were set to 500-550-610-700-800° C. or 550-600-660-750-850° C. and the sixth zone was set to the temperatures shown in Tables 8 and 9. The actual temperature of the part was measured during processing. The estimated peak temperature of each part was 770-830° C. and each part was above 650° C. for a total time of 4-6 seconds. The fully processed samples were then tested for PV performance using a calibrated Berger I-V tester.

The solar cells built according to the method described above were tested for conversion efficiency. A solar cell was placed in a commercial I-V tester for measuring efficiencies (BERGER Lichttechnik GmbH & Co. KG, a manual cell testing system with PCC1011, PSL SCD, PT100 and work station with manual probing unit). The Xe arc lamp in the I-V tester simulated the sunlight with a known intensity, AM 1.5, and irradiated the front surface of the cell. The tester used a multi-point contact method to measure current (I) and voltage (V) to determine the cell's I-V curve. Both fill factor (FF) and efficiency (Eff) were calculated from the I-V curve, Efficiency and fill factor were measured for each sample. For each paste, the paste composition in terms of the particular Pb—W—O Example Number and the amount used are shown in Table 8 along with the mean values of the efficiency for 11 paste samples for each of the various sixth zone furnace temperatures used. For each paste, the paste composition in terms of the particular Pb—W—O and the amount used are shown in Table 9 along with the mean values of the fill factor for 11 paste samples for each of the various sixth zone furnace temperatures used.

TABLE 8

Efficiency of Pastes using Select Glass Frits on Multi-crystalline Solar Cells

| Ex. # Paste | Ex. # Glass | Glass (wt %) | Efficiency % (Mean) | | | | | |
|---|---|---|---|---|---|---|---|---|
| | | | 870° C. | 885° C. | 900° C. | 915° C. | 930° C. | 945° C. |
| 25 | 12 | 2.00 | — | 16.48 | 16.28 | 14.78 | 12.02 | 8.20 |
| 26 | 12 | 3.00 | — | 16.47 | 16.50 | 16.48 | 16.21 | 15.10 |
| 27 | 17 | 2.00 | — | 14.83 | 14.74 | 13.00 | 11.03 | 9.25 |
| 28 | 17 | 3.00 | — | 15.60 | 16.16 | 16.21 | 14.95 | 13.43 |
| 29 | 18 | 2.00 | — | 13.81 | 14.08 | 13.62 | 11.57 | 9.61 |
| 30 | 18 | 3.00 | — | 14.77 | 14.17 | 14.41 | 13.73 | 12.09 |
| 31 | 19 | 2.00 | — | 14.16 | 15.27 | 14.16 | 11.83 | 9.48 |
| 32 | 19 | 3.00 | — | 13.70 | 14.19 | 13.88 | 13.42 | 11.13 |
| 33 | 12 | 2.50 | 16.34 | 16.40 | 15.88 | — | — | — |
| 34 | 16 | 2.50 | 16.43 | 16.52 | 15.60 | — | — | — |
| 35 | 20 | 2.50 | 15.85 | 15.54 | 14.68 | — | — | — |

TABLE 8-continued

Efficiency of Pastes using Select Glass Frits on Multi-crystalline Solar Cells

| Ex. # Paste | Ex. # Glass | Glass (wt %) | Efficiency % (Mean) | | | | | |
|---|---|---|---|---|---|---|---|---|
| | | | 870° C. | 885° C. | 900° C. | 915° C. | 930° C. | 945° C. |
| 36 | 21 | 2.50 | 16.43 | 16.41 | 15.58 | — | — | — |
| 37 | 23 | 2.50 | 16.30 | 16.44 | 16.31 | — | — | — |
| 38 | 12 | 3.00 | 16.09 | 15.83 | 15.80 | — | — | — |
| 39 | 13 | 3.00 | 15.86 | 16.15 | 15.63 | — | — | — |
| 40 | 14 | 3.00 | 16.05 | 16.51 | 16.32 | — | — | — |
| 41 | 15 | 3.00 | 15.87 | 15.99 | 14.61 | — | — | — |

TABLE 9

Fill Factor of Pastes using Select Glass Frits on Multi-crystalline Solar Cells

| Ex. # Paste | Ex. # Glass | Glass (wt %) | Fill Factor (Mean) | | | | | |
|---|---|---|---|---|---|---|---|---|
| | | | 870° C. | 885° C. | 900° C. | 915° C. | 930° C. | 945° C. |
| 25 | 12 | 2.00 | — | 76.47 | 75.27 | 68.81 | 56.49 | 39.75 |
| 26 | 12 | 3.00 | — | 77.44 | 77.39 | 77.02 | 75.30 | 70.30 |
| 27 | 17 | 2.00 | — | 69.04 | 68.52 | 59.89 | 51.66 | 43.16 |
| 28 | 17 | 3.00 | — | 73.30 | 74.63 | 74.87 | 69.97 | 62.40 |
| 29 | 18 | 2.00 | — | 64.64 | 65.48 | 63.65 | 54.17 | 44.63 |
| 30 | 18 | 3.00 | — | 69.34 | 66.40 | 67.65 | 64.20 | 56.12 |
| 31 | 19 | 2.00 | — | 66.26 | 71.37 | 66.24 | 55.37 | 44.68 |
| 32 | 19 | 3.00 | — | 65.23 | 66.94 | 65.70 | 63.66 | 53.56 |
| 33 | 12 | 2.50 | 76.34 | 75.98 | 73.70 | — | — | — |
| 34 | 18 | 2.50 | 76.15 | 76.54 | 72.49 | — | — | — |
| 35 | 20 | 2.50 | 74.42 | 73.66 | 68.87 | — | — | — |
| 36 | 21 | 2.50 | 76.89 | 76.35 | 72.80 | — | — | — |
| 37 | 23 | 2.50 | 76.16 | 76.67 | 75.02 | — | — | — |
| 38 | 12 | 3.00 | 72.89 | 72.30 | 72.16 | — | — | — |
| 39 | 13 | 3.00 | 72.72 | 74.29 | 72.35 | — | — | — |
| 40 | 14 | 3.00 | 74.08 | 75.63 | 75.01 | — | — | — |
| 41 | 15 | 3.00 | 73.38 | 73.85 | 67.95 | — | — | — |

Solar cells for testing the performance of the thick-film pastes prepared as described above were made using 180 micron thick mono-crystalline silicon wafers with a 70-75 Ω/□ phosphorous-doped p-type lightly doped emitter (LDE) layer. Those mono-crystalline wafers were obtained from DuPont Innovalight, Sunnyvale, Calif. The solar cells used were textured by pyramidal acid etching and had an anti-reflection coating (ARC) of $SiN_x$:H. Wafers of 6 inch square were used to measure the efficiency and fill factor for each sample.

Each sample was made by screen-printing using an MicroTek printer set with a squeegee speed of 100-250 mm/sec. The screen used for the 6 inch pseudo-square mono-crystalline wafer had a pattern of 31 finger lines with a 40 or 60 μm opening. AH patterns had three bus bars with a 1.5 mm opening on a 15 μm or a 20 μm emulsion in a screen with 350-360 mesh and 16-23 μm wires. An experimental Al paste was printed on the non-illuminated (back) side of the device.

After each side was printed, the device with the printed patterns was dried for 10-15 minutes in a drying oven with a 150° C. peak temperature. The substrates were then fired front up with a CF7214 Despatch 6-zone IR furnace using a 560 cm/min belt speed and the first five zones were set to 500-550-610-700-800 or 550-600-660-750-850 and the sixth zone was set to the temperatures shown in Tables 10 and 11. The actual temperature of the part was measured during processing. The estimated peak temperature of each part was 770-830° C. and each part was above 650° C. for a total time of 4-6 seconds. The fully processed samples were then tested for PV performance using a calibrated Berger 1-V tester.

The solar cells built according to the method described above were tested for conversion efficiency. A solar cell was placed in a commercial 1-V tester for measuring efficiencies (BERGER Lichttechnik GmbH & Co. KG, a manual cell testing system comprised with PCC1011, PSL SCD, PT100 and work station with manual probing unit). The Xe arc lamp in the 1-V tester simulated the sunlight with a known intensity, AM 1.5, and irradiated the front surface of the cell. The tester used a multi-point contact method to measure current (I) and voltage (V) to determine the cell's 1-V curve. Both fill factor (FF) and efficiency (Eff) were calculated from the I-V curve. Efficiency and fill factor were measured for each sample. For each paste, the paste composition in terms of the particular Pb—W—O Example Number and the amount used are shown in Table 10 along with the mean values of the efficiency for 11 paste samples for each of the various sixth zone furnace temperatures used. For each paste, the paste composition in terms of the particular Pb—W—O and the amount used are shown in Table 11 along with the mean values of the fill factor for 11 paste samples for each of the various sixth zone furnace temperatures used.

TABLE 10

Efficiency of Pastes using Select Glass Frits on Mon-
crystalline Lightly Doped Emitter (LDE) Solar Cells

| Ex. # Paste | Ex. # Glass | Glass (wt %) | Efficiency % (Mean) | | | | | |
|---|---|---|---|---|---|---|---|---|
| | | | 870° C. | 885° C. | 900° C. | 915° C. | 930° C. | 945° C. |
| 25 | 12 | 2.00 | — | 16.48 | 16.28 | 14.78 | 12.02 | 8.20 |
| 26 | 12 | 3.00 | — | 12.29 | 13.28 | 13.73 | 14.54 | 13.46 |

TABLE 11

Fill Factor of Pastes using Select Glass Frits on Mon-
crystalline Lightly Doped Emitter (LDE) Solar Cell

| Ex. # Paste | Ex. # Glass | Glass (wt %) | Fill Factor (Mean) | | | | | |
|---|---|---|---|---|---|---|---|---|
| | | | 870° C. | 885° C. | 900° C. | 915° C. | 930° C. | 945° C. |
| 25 | 12 | 2.00 | — | 16.48 | 75.27 | 68.81 | 56.49 | 39.75 |
| 26 | 12 | 3.00 | — | 77.44 | 77.39 | 77.02 | 75.30 | 70.30 |

Adhesion Tests

Busbars made from the select pastes on 200 micron thick multi crystalline 6 inch square silicon wafers, as used for the data shown in Tables 8 and 9 were tested for adhesion. An adhesion test was carried out using semi-automated soldering equipment, Semtek SCB-160. The sample was loaded over a hot stage where its temperature is pre-set for 180° C. An array of heated pins which press loaded ribbon over the busbar was pre-set for a temperature at 180° C. The solder ribbon consisted of a 0.17 mm thick and 2 mm wide copper core layer which was coated with 16-20 μm solder layer, 60Sn/40Pb solder alloy. Solder ribbon was supplied from the spool and dipped into Kester 952S flux before it was attached onto the busbar in the hot plate. When the solder ribbon was bonded onto the busbar and cooled to room temperature, the solder ribbon was pulled in a 180° direction in a MOGRL pull tester. Adhesion peel strength in Newton (N) was recorded when the solder ribbon was pulled off the underlying busbar of each sample with a speed of 120 mm/min. The results are shown in Table 12.

TABLE 12

Busbar Adhesion Pull Test Results

| Ex. # Paste | Ex. # Glass | Glass (wt %) | Mean Adhesion (N) |
|---|---|---|---|
| 25 | 12 | 2.00 | 1.15 |
| 26 | 12 | 3.00 | 1.91 |
| 28 | 17 | 3.00 | 2.10 |
| 30 | 18 | 3.00 | 1.88 |
| 31 | 19 | 2.00 | 1.57 |
| 33 | 12 | 2.50 | 0.63 |
| 34 | 16 | 2.50 | 0.61 |
| 36 | 21 | 2.50 | 0.48 |
| 37 | 23 | 2.50 | 0.48 |
| 38 | 12 | 3.00 | 0.64 |
| 39 | 13 | 3.00 | 0.69 |
| 40 | 14 | 3.00 | 0.80 |
| 41 | 15 | 3.00 | 0.32 |

What is claimed is:

1. A thick-film paste composition comprising:
   a) 80-99.5 wt % of a source of electrically conductive metal;
   b) 0.5 to 20 wt % of a vanadium-free, tellurium-free lead-tungsten-based oxide; and
   c) an organic medium;
   wherein said source of electrically conductive metal and said vanadium-free, tellurium-free lead-tungsten-based oxide are dispersed in said organic medium and wherein the above wt % are based on the total weight of said source of electrically conductive metal and said vanadium-free, tellurium-free lead-tungsten-based oxide, said vanadium-free, tellurium-free lead-tungsten-based oxide consisting of 75-88wt % PbO and 12-25 wt % $WO_3$, wherein the wt % of PbO and $WO_3$ are based on the total weight of said vanadium-free tellurium-free lead-tungsten-based oxide.

2. The thick-film paste composition of claim 1, wherein said electrically conductive metal is selected from the group consisting of Ag, Cu, Au, Pd, Pt, Sn, Al and Ni.

3. The thick-film paste composition of claim 2, wherein said electrically conductive metal is Ag.

4. A semiconductor device comprising an electrode formed from a thick-film paste composition comprising:
   a) 80-99.5 wt % of a source of electrically conductive metal;
   b) 0.5 to 20 wt % of a vanadium-free, tellurium-free lead-tungsten-based oxide; and
   c) an organic medium;
   wherein said source of electrically conductive metal and said vanadium-free, tellurium-free lead-tungsten-based oxide are dispersed in said organic medium and wherein the above wt % are based on the total weight of said source of electrically conductive metal and said vanadium-free, tellurium-free lead-tungsten-based oxide, said vanadium-free, tellurium-free lead-tungsten-based oxide consisting of 75-88 wt % PbO and 12-25 wt % $WO_3$, wherein the wt % of PbO and $WO_3$ are based on the total weight of said vanadium-free tellurium-free lead-tungsten-based oxide.

5. The semiconductor device of claim 4, wherein said electrically conductive metal is selected from the group consisting of Ag, Cu, Au, Pd, Pt, Sn, Al and Ni.

6. The semiconductor device of claim 5, wherein said electrically conductive metal is Ag.

* * * * *